(12) United States Patent
Sbuell et al.

(10) Patent No.: US 7,907,000 B2
(45) Date of Patent: Mar. 15, 2011

(54) CIRCUIT AND METHOD FOR INTEGRATING A VOLTAGE SIGNAL

(75) Inventors: Richard Sbuell, Graz (AT); Albert Missoni, Graz (AT)

(73) Assignee: Infineon Technologies AG, Neubiberg (DE)

( * ) Notice: Subject to any disclaimer, the term of this patent is extended or adjusted under 35 U.S.C. 154(b) by 128 days.

(21) Appl. No.: 12/240,196

(22) Filed: Sep. 29, 2008

(65) Prior Publication Data

US 2009/0085641 A1 Apr. 2, 2009

(30) Foreign Application Priority Data

Sep. 28, 2007 (DE) .......................... 10 2007 046 500
Aug. 20, 2008 (DE) .......................... 10 2008 038 573

(51) Int. Cl.
*H03K 5/00* (2006.01)

(52) U.S. Cl. ..................... 327/337; 327/554; 327/552

(58) Field of Classification Search .......... 327/335–345, 327/551–559
See application file for complete search history.

(56) References Cited

U.S. PATENT DOCUMENTS

| 6,556,073 B2 * | 4/2003 | Morie et al. .................. 327/554 |
| 7,239,196 B2 * | 7/2007 | Hasegawa ..................... 327/552 |
| 7,535,288 B2 * | 5/2009 | Iida .............................. 327/554 |

* cited by examiner

*Primary Examiner* — Dinh T. Le
(74) *Attorney, Agent, or Firm* — Dickstein, Shapiro LLP

(57) ABSTRACT

A circuit arrangement having a signal input configured to be supplied with a voltage signal; a first operational transconductance amplifier (OTA) having a voltage input that may be coupled to the signal input; at least one second OTA having a voltage input that may be coupled to the signal input; and at least one output capacitor which may be coupled to an output of the first OTA and to an output of the at least one second OTA, wherein an identical potential is set at the outputs of the first OTA and of the at least one second OTA.

13 Claims, 1 Drawing Sheet

US 7,907,000 B2

CIRCUIT AND METHOD FOR INTEGRATING A VOLTAGE SIGNAL

CROSS-REFERENCE TO RELATED APPLICATIONS

This application claims priority to German Patent Application Serial Nos. 102007046500.0 filed Sep. 28, 2007, and 102008038573.5 filed Aug. 20, 2008, which are incorporated herein by reference in their entireties.

BACKGROUND

In signal processing, it is often necessary to amplify or integrate an input signal in order to simulate the signal or condition it in such a manner that it can be evaluated. In this case, it is occasionally necessary to carry out impedance matching during signal processing. One example of such a use is the demodulation of the ASK-modulated signal in so-called RFID technology.

For this purpose, it is necessary to track the input signal at two different speeds. To this end, the signal has hitherto been simulated using a so-called multi-stage "OTA circuit". In the case of such an "OTA circuit", which is also called an operational transconductance amplifier or VC-OP and is referred to below as an OTA for short, both inputs have a high impedance and the output behaves like a high-impedance current source whose current is controlled by the voltage difference at the inputs. In addition to a small offset voltage, an OTA also makes it possible to dynamically drive capacitive loads. If the output current of an OTA is supplied to a capacitor, the resulting circuit arrangement has the function of an integrator.

In order to then be able to track an input signal at two different speeds, the multi-stage OTA has hitherto been operated using two current sources of different intensity, a current source which provides a higher current being connected to the OTA in order to track the signal which changes more rapidly. On the one hand, this results in interference signals during the switching times and, on the other hand, the multi-stage OTA gives rise to a large offset.

DESCRIPTION OF THE DRAWINGS

Embodiments of a circuit arrangement and a method for integrating a voltage signal is explained in detail below with reference to the drawings.

DESCRIPTION OF THE INVENTION

In the following description, identical elements are denoted using identical reference symbols, in which case it is pointed out that they are exemplary embodiments and the invention as such is not restricted to these exemplary embodiments.

Figure 1:
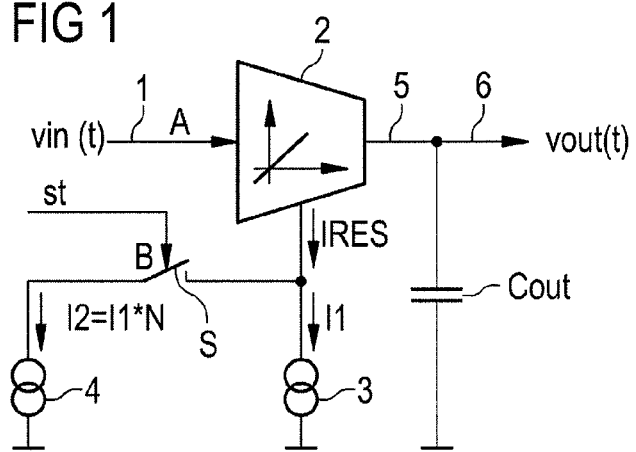
FIG. 1 shows an integrator circuit having an OTA with a current-controlled integration speed.

The circuit arrangement illustrated in FIG. 1 is provided with a signal input 1 which is supplied with an input signal $V_{in}(t)$. This input signal $V_{in}(t)$ is supplied from the signal input 1 to a voltage input 1A of an OTA 2. The OTA 2 is implemented, in particular, using operational amplifiers. In the case of an OTA (Operational Transconductance Amplifier), both inputs (only one shown) are provided with a high impedance and the output behaves like a current source which has the highest possible impedance and whose current is controlled by the voltage difference at the inputs. This OTA 2 is operated using a so-called "BIAS current" $I_{res}$. This "BIAS" current $I_{res}$ is fed from a first current source 3, which provides a first current I1, and a second current source 4 which provides a second current I2, the second current I2 being greater than I1 by the factor N. Furthermore, the second current source can be connected to, and disconnected from, the OTA 2 by means of a switch S. The switch S is activated and deactivated by means of a control signal ST which is applied to the control input B. The OTA 2 has an output connection 5 which is connected to an output capacitor $C_{out}$ and to a circuit output 6 of a circuit arrangement. The output signal $V_{out}$ from the circuit arrangement is applied to the circuit output 6.

In order to match the integrator to a greater transient property of the input signal $V_{in}(t)$, that is to say in order to increase the integration speed of the OTA 2, the switch S is closed using the control signal ST and the second current source 4, which provides a current which is a multiple of the current I1 by the factor N and is connected in parallel with the first current source 3. The BIAS current $I_{RES}$ of the integration circuit OTA 2 is thus increased by the factor N, with the result that the input signal $V_{in}(t)$ can be followed in an improved manner.

Figure 2:
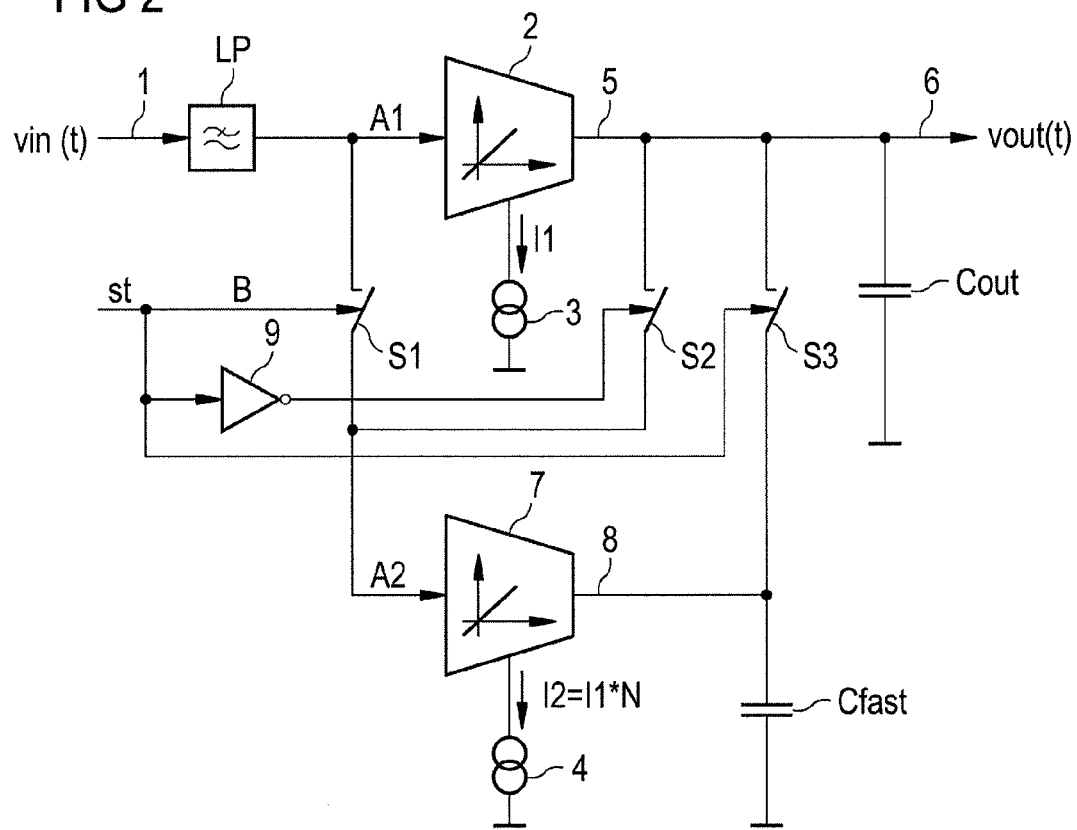
FIG. 2 shows an integrator circuit having two OTAs with different integration speeds.

FIG. 2 shows an improved arrangement, identical reference symbols representing identical or comparable elements in FIG. 1.

The input signal $V_{in}(t)$ is supplied to the signal input 1 and is supplied, via a low-pass filter LP, to the voltage input A1 of the first charging/discharging circuit 2. The first charging/discharging circuit 2 is provided with an OTA which has the properties which have already been described. In particular, the OTA is implemented using operational amplifier circuits. The voltage output 5 of the first charging/discharging circuit 2 is supplied to the circuit output 6. As in FIG. 1, an output capacitor $C_{out}$ whose second connection is connected to a reference potential is present at the circuit output 6. The first current source 3 supplies the first current I1 to the first charging/discharging circuit 2. A first switching connection of a first switching element S1 is connected to the voltage input A1 of the first charging/discharging circuit 2 and a second switching connection of said switching element is connected to a voltage input A2 of a second charging/discharging circuit 7. The second charging/discharging circuit 7 likewise has an OTA. A first switching connection of a second switching element S2 is connected to the voltage output 5 of the first charging/discharging circuit 2 and a second switching connection of said switching element is connected to the voltage input A2 of the second charging/discharging circuit 7. A first switching connection of a third switching element S3 is connected to the voltage output 5 of the first charging/discharging circuit 2 and a second switching connection of said switching element is connected to a voltage output 8 of the second charging/discharging circuit 7.

A second capacitor $C_{fast}$ is likewise connected to the voltage output 8 of the second charging/discharging circuit 7. A second connection of the capacitor $C_{fast}$ is connected to reference potential. The charging current of the second charging/discharging circuit 7 is supplied from a second current source 4 supplying a second current I2. The second current I2 is N times greater than the first current I1 from the first current source. N is preferably ten or more. The first charging/discharging circuit 2 thus corresponds to a slowstage integrator circuit, whereas the second charging/discharging circuit 7 corresponds to a fast-stage integrator circuit.

The control signal ST can again be supplied to the integrator circuit at a control input B. The control signal ST switches the first, second and third switching elements S1, S2, S3 from a first switching state to a second switching state, the respective switching element connecting the respective first connection and the respective second connection in an electrically conductive manner only in the first switching state. The switching elements S1, S2, S3 are preferably in the form of transistors, the control signal ST being applied to the control inputs of the transistors. The transistors are on or off on the basis of the control signal level. If the transistor is on, this corresponds to the first switching state, and if it is off, this corresponds to the second switching state.

The integrator circuit can now be operated in a first operating mode or in a second operating mode on the basis of the control signal ST. In the first operating mode, the control signal ST is designed in such a manner that the first switching element S1 and the third switching element S3 are connected in the second switching state and the second switching element S2 is connected in the first switching state. In the second operating mode of the integrator circuit, the control signal ST is designed in such a manner that the first switching element S1 and the third switching element S3 are connected in the first switching state and the second switching element S2 is connected in the second switching state.

One exemplary embodiment for changing over the operating modes is shown in FIG. 2 and is described below.

The switching elements S1, S2 and S3 each are provided with a control input. The control input B is directly connected to the control inputs of S1 and S3. The control input of the second switching element S2 is connected to the control input B via an inverter 9. The control signal ST is a digital signal which can assume the "low state" or the "high state". The three switching elements S1, S2 and S3 are connected to the inverter 9 in such a manner that, when the control signal ST is in the "low state", the switching elements S1 and S3 are opened, that is to say assume the second switching state, and the switching element S2 is closed, that is to say assumes the first switching state. If the control signal ST is in the "high state", the switching elements S1 and S3 are closed and the switching element S2 is open.

In terms of functionality, this means that, when the control signal ST is in the "low state", the integrator circuit is in the second operating mode. The output 5 of the first charging/discharging circuit 2 is then connected to the voltage input connection A2 of the second charging/discharging circuit 7 and the voltage output 8 of the second charging/discharging circuit 7 follows the input signal and charges or discharges the second capacitor $C_{fast}$ accordingly. Otherwise, however, the output connection 8 of the second charging/discharging circuit 7 is decoupled from the circuit output 6. This second operating mode corresponds to the so-called slow mode of the integrator circuit since the output of the second charging/discharging circuit is disconnected from the output capacitor.

If the control signal ST changes from the "low state" to the "high state", the second switching element S2 is opened and the first switching element S1 and the third switching element S3 are closed. The first operating mode is set with these changed switching states of the switching elements S1, S2 and S3. The input signal $V_{in}(t)$ is thus applied to the voltage input A2 of the second charging/discharging circuit 7 and the voltage output 8 of the second charging/discharging circuit 7 is connected to the circuit output 6.

The second charging/discharging circuit 7, which is supplied by the second current source 4 which provides N times the load current I1 which is available to the first charging/discharging circuit 2, thus charges or discharges the output capacitor $C_{out}$. This operating mode corresponds to the fast mode of the circuit since the input signal can be followed much faster as a result of the higher current I2. An integrator with a higher operating speed is thus available, said integrator having, even before the changeover, the instantaneous level which was previously provided at the circuit output 6 by the first charging/discharging circuit 2. There is now no level fluctuation when changing over from the "low state" to the "high state" and thus no interference caused by charge reversal processes.

The invention claimed is:

1. A circuit arrangement comprising:
   a signal input configured to be supplied with a voltage signal;
   a first operational transconductance amplifier (OTA) having a voltage input that is couplable to the signal input;
   at least one second OTA having a voltage input that is couplable to the signal input;
   at least one output capacitor which is couplable to an output of the first OTA and to an output of the at least one second OTA, wherein the outputs of the first OTA and of the at least one second OTA have an identical potential;
   a first switching element having first and second connections, the first connection being coupled to the signal input and the second connection being coupled to the voltage input of the at least one second OTA;
   a second switching element having first and second connections, the first connection being coupled to the output of the first OTA and the second connection being coupled to the voltage input of the at least one second OTA;
   a third switching element having first and second connections, the first connection being coupled to the output of the first OTA and the second connection being coupled to the output of the at least one second OTA; and
   a control input configured to be supplied with a control signal,
   wherein the first, second and third switching elements are configurable to be switched from a first switching state to a second switching state based on the control signal, and the respective switching element connects the respective first connection and the respective second connection in an electrically conductive manner only in the first switching state.

2. The circuit arrangement as claimed in claim 1, further comprising:
   a first current source coupled to the first OTA and configured to provide a first current; and
   a second current source coupled to the at least one second OTA and configured to provide a second current.

3. The circuit arrangement as claimed in claim 1, wherein the circuit arrangement is operated in a first operating mode or in a second operating mode based on the control signal.

4. The circuit arrangement as claimed in claim 3, wherein in the first operating mode the control signal causes the first and third switching elements to be connected in the second switching state and the second switching element to be connected in the first switching state, and in the second operating mode the control signal causes the first and third switching elements to be connected in the first switching state and the second switching element to be connected in the second switching state.

5. The circuit arrangement as claimed in claim 1, further comprising a low-pass filter coupled upstream of the signal input.

6. The circuit arrangement as claimed in claim 1, further comprising a second capacitor having a first connection coupled to the output of the at least one second OTA and a second connection coupled to reference potential.

7. The circuit arrangement as claimed in claim 2, wherein the ratio of the second current to the first current is ten or more.

8. An integration circuit comprising:
a first charging/discharging circuit;
at least one second charging/discharging circuit, the first and second charging/discharging circuits charging an output capacitor, which is coupled to the first and second charging/discharging circuits, based on an input signal,
wherein the first charging/discharging circuit and the at least one second charging/discharging circuit each have a voltage input and an output, the voltage inputs being able to be coupled to a signal input, which are configured to be supplied with an input signal, and
wherein the at least one second charging/discharging circuit is configured such that a potential applied to its output follows a potential at the output of the first charging/discharging circuit; and
switches configurable such that in a first operating mode the second charging/discharging circuit is coupled in series with the first charging/discharging circuit and in the second operating mode the first and second charging/discharging circuits are coupled in parallel.

9. The integration circuit as claimed in claim 8, wherein the first and second charging/discharging circuits are each provided with a current source, and the current source for the first charging/discharging circuit provides a first current and the current source for the second charging/discharging circuit provides a second current which is different from the first current.

10. The integration circuit as claimed in claim 8, wherein a control signal controls the switches to cause the integration circuit to switch between the first and second operating modes.

11. A method for integrating a voltage signal at different speeds, comprising:
converting the voltage signal into a first charging current from a first current source at a first speed, and supplying the first charging current to an output capacitor;
converting the voltage signal into a second charging current, which is different from the first charging current, from a second current source at a second speed, and supplying the second charging current to the output capacitor,
wherein the output potential from the output capacitor is the same irrespective of the speed; and
switching between a first operating mode and a second operating mode, wherein in the first operating mode the first charging current and the second charging current flow in series, and in the second operating mode the first charging current and the second charging current flow in parallel.

12. The method as claimed in claim 11, further comprising charging a second capacitor using the second charging current.

13. The method as claimed in claim 11, wherein the ratio of the second charging current to the first charging current is ten or more.

* * * * *